(12) United States Patent
Mitzi et al.

(10) Patent No.: US 8,613,973 B2
(45) Date of Patent: Dec. 24, 2013

(54) PHOTOVOLTAIC DEVICE WITH SOLUTION-PROCESSED CHALCOGENIDE ABSORBER LAYER

(75) Inventors: David B. Mitzi, Mahopac, NY (US); Wei Liu, Yorktown Heights, NY (US); Min Yuan, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1271 days.

(21) Appl. No.: 11/951,858

(22) Filed: Dec. 6, 2007

(65) Prior Publication Data

US 2009/0145482 A1    Jun. 11, 2009

(51) Int. Cl.
*B05D 5/06* (2006.01)

(52) U.S. Cl.
USPC .......................................................... 427/74

(58) Field of Classification Search
USPC .......................................................... 427/226
See application file for complete search history.

(56) References Cited

U.S. PATENT DOCUMENTS

| | | | |
|---|---|---|---|
| 4,242,374 A | 12/1980 | Sansregret | |
| 4,541,973 A * | 9/1985 | Arons | 264/611 |
| 5,910,336 A | 6/1999 | Ishihara et al. | |
| 7,224,036 B2 | 5/2007 | Kojima et al. | |
| 2005/0009225 A1 * | 1/2005 | Mitzi et al. | 438/59 |
| 2005/0028861 A1 | 2/2005 | Aoki et al. | |
| 2005/0183767 A1 * | 8/2005 | Yu et al. | 136/263 |
| 2005/0183768 A1 * | 8/2005 | Roscheisen et al. | 136/263 |
| 2005/0202589 A1 * | 9/2005 | Basol | 438/102 |
| 2006/0060237 A1 | 3/2006 | Leidholm et al. | |

FOREIGN PATENT DOCUMENTS

| | | |
|---|---|---|
| EP | 1511087 | 8/2004 |
| JP | 10-219472 | 8/1998 |
| WO | WO99/48158 | 9/1999 |

OTHER PUBLICATIONS

Thin solid Films, "Low-Cost CIGS solar cells by paste coating and selenization" vol. 480-481, pp. 486-490, Jun. 1, 2005.

Vijay K. Kapur, et al., Mat. Res. Soc. Symp. Proc., vol. 668, "Nanoparticle Oxides Precursor Inks for Thin Film Copper Indium Gallium Selenide (CIGS) Solar Cells", 2001.

Ki-Hyun Kim, et al., Mater. Res. Soc. Symp. Proc. vol. 836, "Preparation of CuInGASe2 Absorber Layer by Nanoparticles-Based Spray Deposition".

R.N. Bhattacharya, et al. National Renewable Energy Laboratory, "15.4% CuIn1-xGaxSe2-Based Photovoltaic Cells from Solution-Based Precursor Films", May 1999.

* cited by examiner

*Primary Examiner* — Robert Vetere
(74) *Attorney, Agent, or Firm* — Vazken Alexanian

(57) ABSTRACT

The present invention provides a photovoltaic device, such as, a solar cell, having a substrate and an absorber layer disposed on the substrate. The absorber layer includes a doped or undoped composition represented by the formula: $Cu_{1-y}In_{1-x}Ga_xSe_{2-z}S_z$ wherein $0 \le x \le 1$; $0 \le y \le 0.15$ and $0 \le z \le 2$; wherein the absorber layer is formed by a solution-based deposition process which includes the steps of contacting hydrazine and a source of Cu, a source of In, a source of Ga, a source of Se, and optionally a source of S, and further optionally a source of a dopant, under conditions sufficient to produce a homogeneous solution; coating the solution on the substrate to produce a coated substrate; and heating the coated substrate to produce the photovoltaic device. A photovoltaic device and a process for making same based on a hydrazinium-based chalcogenide precursor are also provided.

18 Claims, 19 Drawing Sheets

US 8,613,973 B2

PHOTOVOLTAIC DEVICE WITH SOLUTION-PROCESSED CHALCOGENIDE ABSORBER LAYER

BACKGROUND OF THE INVENTION

1. Field of the Invention

The problem being addressed by this disclosure is that of reducing the cost of fabricating a high-performance thin-film solar cell. In particular, a low-cost solution-based process for depositing the chalcogenide-based absorber layer in a thin-film solar cell is disclosed.

2. Description of the Related Art

World demand for energy is expected to more than double by 2050 and to more than triple by the end of the century. Incremental improvements in existing energy technologies will not be adequate to supply this demand in a sustainable way. Sunlight represents by far the largest of all carbon-neutral potential energy sources. More energy from sunlight strikes the earth in one hour than all the energy consumed on the planet in one year. However, currently, less than 0.1% of the world's electricity is generated using solar electricity generation (see, for example, *Basic Research Needs for Solar Energy Utilization*, Report of the Basic Energy Sciences Workshop on Solar Energy Utilization, Apr. 18-21, 2005, US Department of Energy, Office of Science).

The reason for the lack of widespread adoption of PV technology is directly linked with the high cost/watt of this technology. Industrial electricity today costs, on average, about 0.06$/kWh in the United States. Solar electricity costs vary between approximately 0.2-0.8 $/kWh depending upon the system and climate. To be competitive without subsidies, photovoltaics must achieve an at least a 5-10× reduction in the per kWh cost.

Solar cells incur no fuel expense, but they do have significant capital cost. The cost for the electricity produced by a solar cell is calculated by amortizing the capital cost over the lifetime of the cell (about 30 years) and considering the total electrical output energy produced over the cell lifetime. The cost figure of merit for PV cell modules ($/$W_p$) is determined by the ratio of the module cost per unit area ($/m^2$) divided by the maximum amount of electric power delivered per unit of cell area ($W_p/m^2$). Consequently, to significantly reduce the cost of PV technology, it is necessary both to maintain/increase cell efficiency (enabling higher WP/$m^2$), as well as to significantly reduce the costs of PV module fabrication and installation (see, for example, *Basic Research Needs for Solar Energy Utilization*, Report of the Basic Energy Sciences Workshop on Solar Energy Utilization, Apr. 18-21, 2005, U.S. Department of Energy, Office of Science).

More than 90% of today's PV production is Si-based. High efficiencies (>20% in laboratory-scale devices) are only achieved for single junction cells in thick crystalline silicon devices. Due to the indirect band gap, which necessitates the thick absorber layer, and the associated high-temperature vacuum-based processing, Si is not an ideal material for an absorber layer. An alternative approach is to look at thin-film direct band gap absorber layers (rather than Si), which are typically metal chalcogenides offering a very high absorptivity for solar photons.

The two principal metal-chalcogenide-based thin-film technologies are CdTe and Cu(In,Ga)Se$_2$ (CIGS). CdTe cells with 16.5% efficiency and CIGS cells with 19.5% efficiency have been made. For comparison, the efficiency of amorphous Si thin-film devices has leveled out at 12% after more than 25 yrs of research and appears to be unlikely to improve substantially any time soon. Given efficiencies approaching 20% and acceptable environmental stability characteristics without using toxic Cd, increasing emphasis is being focused on CIGS-based devices.

FIG. 1 shows a typical CIGS device structure using a glass substrate. The layers and thicknesses in the device are schematically shown. This particular structure of the CIGS-based device known in the art has a substrate (e.g., glass plate, flexible foil, etc.), a molybdenum back contact, the CIGS absorber layer, a thin buffer layer (typically CdS or Cd$_{1-x}$Zn$_x$S), a bilayer of intrinsic and aluminum-doped zinc oxide or indium tin oxide, also known as ITO, as a transparent conductive oxide (TCO) front contact. Finally a metal grid is often used on top to help collect the current generated by the cell. One of the most critical layers, which also is often the thickest layer, is the CIGS absorber layer. Therefore how this layer is deposited can have a big impact on production costs and device efficiency.

FIG. 2 shows a typical CdTe device structure using a glass superstrate. The layers and thicknesses in the device are schematically shown. This is an alternative device structure, typically used for CdTe devices (but it is by no means restricted to this material).

Since the glass forms the top of the device, through which the sun penetrates into the cell, as opposed to forming the base of the structure, this configuration is known as a "superstrate" configuration and that in FIG. 1 is a "substrate" configuration. An advantage of the substrate configuration in FIG. 1 is that the substrate does not need to be optically transparent and therefore a wider range of rigid and flexible materials can act as the substrate. In the case of the superstrate configuration, the optical quality and transparency of the superstrate can significantly impact the efficiency of the device since it can absorb the incident radiation.

Unfortunately, despite the potential for high-efficiency device performance, CIGS is a relatively complicated chemical system, having 4 or more elements (it is often doped with Na and/or S), with the device performance strongly being effected by the detailed chemical composition and compositional depth profile in the device. Since grain boundaries can act as recombination centers for the electrons and holes created during the absorption of a photon (which therefore reduces the device efficiency), it is desirable to deposit films with large (μm-scaled) grains with well-controlled stoichiometry. The CIGS material can accommodate a wide range of variation in chemical composition (e.g., variation in Ga content, Cu:(In,Ga) ratio, etc.), which can also have a substantial effect on device performance. It is therefore a significant challenge to develop techniques for reproducible deposition of thick, i.e., μm scale, well-crystallized layers of this material to act as an absorber layer.

Two multi-step vacuum-based processes represent the principal techniques being used to deposit CIGS films for the highest efficiency devices. One of the most successful techniques in terms of generating high-efficiency is "three-stage co-evaporation" from individual elemental sources in the presence of Se vapor.

The NREL (National Renewable Energy Laboratory) three-stage process for depositing CIGS includes the steps of:

(1) depositing (In,Ga)$_2$Se$_3$ at lower substrate temperature (from about 300° C. to about 350° C.); followed by (2) evaporating Cu and Se at a higher temperature (from about 500° C. to about 560° C.) to yield Cu-rich CIGS; and (3) adding more (In,Ga)$_2$Se$_3$, so that a slightly Cu-deficient final film composition is achieved. A Se vapor treatment is carried out during the cooling step. The Ga/(Ga+In) ratio is typically varied as a function of depth in the film in order to achieve a graded band gap that improves the separation of the photogenerated charge carriers and reduces recombination at the back contact.

Despite the success of this approach in generating high-efficiency small area devices (>19% efficiency), co-evaporation requires strict control over the evaporation fluxes in order to achieve the desired film characteristics, which can be difficult to achieve over large substrate areas. Large-area devices therefore generally have significantly lower efficiencies than for the laboratory-scale devices. In addition, much of the evaporated CIGS material does not end up on the substrate, but rather on the vacuum chamber walls. Thus, the low materials utilization adds to the cost of manufacturing prospective devices.

An alternative vacuum-based deposition approach involves selenization of metallic precursor layers. The stacked metal or alloy layers can be deposited by sputtering or evaporation methods. The incorporation of Se into the films is most commonly carried out under a Se-containing atmosphere at high temperatures, typically significantly above 400° C. $H_2Se$ is one of the most efficient selenization sources. However, it is also very toxic. In addition, the "selenization of metallic precursor layers" approach, being also a multi-step process, requires the use of high temperatures, vacuum chambers, and pumps, which limits its applicability to very large area and flexible plastic substrate applications.

Although reasonably low-cost CIGS solar modules can be produced using the vacuum-based deposition techniques described above, high initial capital investment is necessary to obtain the required sophisticated vacuum deposition equipment and thermal processing equipment with toxic gas handling capability. However, the overall economics will ultimately depend on the production volume and device efficiency. In addition, while deposition on glass can be readily achieved, the use of low-cost and flexible plastics as a substrate is generally not possible due to the high processing temperatures required in the deposition processes (for example, see M. Kernell et al., *Critical Reviews in Solid State and Materials Sciences*, vol. 30, 1-31, 2005; and M. Kaelin et al., *Solar Energy*, vol. 77, 749-756, 2004).

There are two general approaches for solution-based CIGS deposition (see M. Kaelin et al., *Solar Energy*, vol. 77, 749-756, 2004). In the first approach, precursors are decomposed during the solution-deposition on a substrate to form CIGS directly during the deposition. Examples of this approach include spray pyrolysis and direct electrodeposition of CIGS. The second approach involves depositing a precursor material on the substrate, with a subsequent chemical treatment and/or selenization process, often at high temperatures. Examples of this approach include electrodeposition of metal layers and nanoparticle precursor approaches.

As an example, spray pyrolysis and spray CVD, which employ organometallic precursors that are pyrolized on a substrate, have been explored for many years, but have generally resulted in CIGS devices with low device efficiency (<5%). In addition, these approaches generally require a high temperature post-deposition heat treatment to remove precursor impurities and improve crystallinity (for example, see M. Kaelin et al., *Solar Energy*, vol. 77, 749-756, 2004; S. Duchemin et al., *Proceedings of the 9th EPVSEC*, Freiburg, Germany, 476-479, 1989; and J. D. Harris et al., *Mater. Sci. Eng. B.*, vol. 98, 150-155, 2003).

Electrodeposition is an alternative approach to directly depositing CIGS on a conducting substrate (see, for example, D. Guimard et al., *Proceedings of the 29th IEEE Photovoltaic Specialists Conference*, New Orleans, May 21-24, 2002, 692-695; and M. E. Calixto et al., *Proceedings of the 31st IEEE Photovoltaic Specialists Conference*, Lake Buena Vista, Fla., Jan. 3-7, 2005, 378-381).

However, the above approaches generally require a high-temperature post-deposition heat treatment (generally in a Se-containing atmosphere) and have typically yielded quite low efficiency devices (<10%), unless post-deposition vacuum evaporation processes are employed to correct the film compositional makeup (see R. N. Bhattacharya et al., *Thin Solid Films*, vol. 361-362, 396-399, 2000). In addition, the process of electrochemical deposition is not as high-throughput as selected other solution-based processes, such as, spin-coating, doctor blading and printing.

Electrodeposition of the metals, followed by a post deposition Se treatment, and high-temperature anneal, have also been demonstrated yielding device efficiencies below 10% (A. Kampmann et al., *Mat Res. Soc. Sympos. Proc.*, vol. 763, B8.5.1-B8.5.6, 2003).

Nanoparticle precursor approaches, such as those employed by ISET (International Solar Electric Technology, Inc.) and Nanosolar, two start-up companies focusing on the solution-deposition of CIGS, rely on forming a suspension of Cu, In and Ga oxide or metal nanoparticles in a solution, which can then be coated onto a Mo-coated surface during the device fabrication. If an oxide precursor is used, the dried precursor is first reduced under a hydrogen atmosphere at high temperature to form a metal-alloy layer. This alloy layer is then annealed under $H_2Se$ (again at high temperature) to form the CIGS absorber layer. Solar cells based on this approach have yielded efficiencies as high as 13.7% on glass, 13% on Mo foil, and 8.9% on polyimide foil. The disadvantages of this approach include potential incorporation of carbon impurities from the nanoparticle capping layer, which limits achievable efficiency.

These processes also generally employ multiple high-temperature steps, as well as the handling of toxic selenium sources in the vapor phase (e.g., $H_2Se$). Starting from the nanoparticle precursors also renders it difficult to achieve sufficient grain growth and phase homogeneity during the deposition process, without a high-temperature thermal treatment (see V. K. Kapur et al., Proceedings of the DOE Solar Program Review Meeting (DOE/GO-102005-2067), 135-135, 2004; and C. Eberspacher et al., *Proceedings of the 29th IEEE Photovoltaic Specialists Conference*, New Orleans, May 21-24, 2002, 684-687).

Thin films of CIS (CIGS without the Ga) have also been prepared by spin-coating using organic-based Cu—In naphthenates as soluble precursors. The process requires a subsequent high-temperature selenization reaction in vacuum-sealed ampoules. So far, no devices have been demonstrated using this approach (see S. Merdes et al., *Proceedings of the 21st European Photovoltaic Solar Energy Conference*, Dresden, Germany, Sep. 4-8, 2006, 1870-1873).

The references/patents found relating to solution-based processing of CIGS absorber layers generally refer to:

(1) nanoparticle approaches to deposition, whereas the present approach is a molecular precursor approach;

(2) precursor approaches that lead to oxide, nitrate, and related materials which need to be converted into chalcogenide materials using a post deposition anneal, in the presence of a chalcogen-containing gas.

Thus, the disadvantages of the known solution-based film processing approaches include:

(1) difficulty in producing films with sufficiently low levels of impurities. The lack of a vacuum environment during processing and presence of foreign elements in the starting solution necessitate a careful selection of precursors to avoid film contamination;

(2) difficulty in achieving phase purity, compositional control, and grading throughout the film thickness, in particular with respect to Ga concentration;

(3) difficulty in reducing the high temperatures and simplifying the multistep processing that is required for the solution-based approaches; and (4) difficulty in controlling the grain structure in solution-processed films. Poor grain structure severely limits device efficiency.

Given these disadvantages of the presently known processes for solution-depositing CIGS absorber layers, it is desirable to develop devices in which high quality CIGS layers can be reproducibly deposited using a simpler, cleaner, lower-cost and higher throughput process which can overcome these disadvantages.

Accordingly, the present invention provides such a process, which produces devices having high quality CIGS layers.

SUMMARY OF INVENTION

The present invention provides a photovoltaic device having:

a substrate; and an absorber layer disposed on the substrate;

wherein the absorber layer includes a doped or undoped composition represented by the formula:

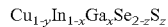
$Cu_{1-y}In_{1-x}Ga_xSe_{2-z}S_z$ wherein $0 \leq x \leq 1$; and $0 \leq y \leq 0.15$; and $0 \leq y \leq 2$; and wherein the absorber layer is formed by a solution-based deposition process that does not rely on carbon-, oxide-, nitrate-, chloride-, bromide-, or iodide-containing precursors.

The present invention also provides two solution-based deposition processes for preparing the absorber layer in the photovoltaic device.

The first solution-based deposition process includes the steps of:

contacting hydrazine and a source of Cu, a source of In, a source of Ga, a source of Se, and optionally a source of S, and further optionally a source of a dopant, under conditions sufficient to produce a homogeneous solution;

coating the solution on the substrate to produce a coated substrate; and heating the coated substrate to produce the absorber layer.

The second solution-based deposition process includes the steps of:

contacting a hydrazinium-based chalcogenide precursor and a solvent, under conditions sufficient to produce a homogeneous solution;

coating said solution on said substrate to produce a coated substrate; and heating said coated substrate to produce the absorber layer.

The optimized photovoltaic devices according to the present invention are lower cost and are expected to operate with better electrical characteristics than analogous devices in which the absorber layer is deposited using other solution-based approaches.

DESCRIPTION OF THE PREFERRED EMBODIMENTS

Figure 1:
FIG. 1 shows a typical CIGS device structure using a glass substrate. The layers and thicknesses in the device are schematically shown.
Figure 2:
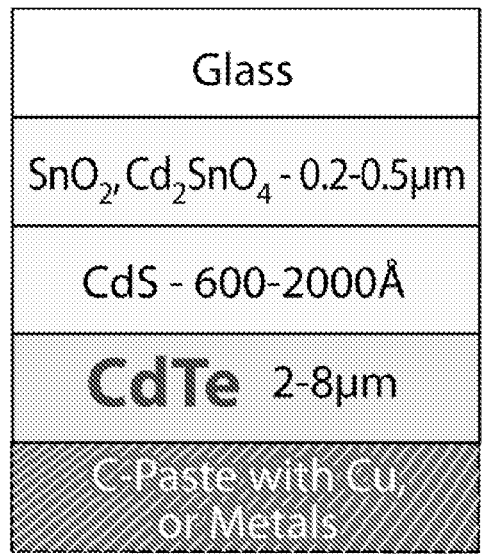
FIG. 2 shows a typical CdTe device structure using a glass superstrate. The layers and thicknesses in the device are schematically shown.

Provided herein is an improved photovoltaic device, such as, a solar cell, which has the general structure shown in FIGS. 1 and 2, wherein the chalcogenide-based absorber layer is deposited using a hydrazine-based precursor using a solution-based deposition method.

In one embodiment, the present invention provides a photovoltaic device comprising:
a substrate; and
an absorber layer disposed on said substrate;
wherein said absorber layer comprises a doped or undoped composition represented by the formula:

$$Cu_{1-y}In_{1-x}Ga_xSe_{2-z}S_z$$

wherein $0 \leq x \leq 1$; and
$0 \leq y \leq 0.15$; and
$0 \leq y \leq 2$;
wherein the absorber layer is formed by a solution-based deposition process comprising the steps of:
contacting hydrazine and a source of Cu, a source of In, a source of Ga, a source of Se, and optionally a source of S, and further optionally a source of a dopant, under conditions sufficient to produce a homogeneous solution;
coating said solution on said substrate to produce a coated substrate; and
heating said coated substrate to produce said photovoltaic device.

The source of Cu, said source of In, said source of Ga, said source of Se, and said source of S, if present, are in amounts sufficient to produce an absorber layer having a predetermined composition. The solution-based deposition process employs a soluble molecular precursor in a solution which is substantially free of C, O, Cl, Br, and I impurities.

In another embodiment, the present invention provides a photovoltaic device comprising:
a substrate; and
an absorber layer disposed on said substrate;
wherein said absorber layer comprises a doped or undoped composition represented by the formula:

$$Cu_{1-y}In_{1-x}Ga_xSe_{2-z}S_z$$

wherein $0 \leq x \leq 1$; and
$0 \leq y \leq 0.15$; and
$0 \leq y \leq 2$; and
wherein the absorber layer is formed by a solution-based deposition process comprising the steps of:
contacting a hydrazinium-based chalcogenide precursor and a solvent, under conditions sufficient to produce a homogeneous solution;
coating said solution on said substrate to produce a coated substrate; and
heating said coated substrate to produce said photovoltaic device.

The solvent in this case is a non-hydrazine solvent, such as, ethanolamine, DMSO, or a mixture thereof. In this case, the solution-based deposition process employs a hydrazinium-based chalcogenide precursor in a solution which is free of Cl, Br, or I impurities.

The solution-processed absorber layer prepared according to the present invention using the hydrazine-based precursor approach can also be used to prepare a variety of metal chalcogenide absorber layers in addition to CIGS. The key point is deposition of the chalcogenide-based absorber layer using the hydrazine-based precursor approach, which provides a more economical PV device with better electrical characteristics than for devices fabricated using other solution-deposition approaches for the absorber layer.

The steps of the current processes are outlined below:
(1) A solution of the metal chalcogenide material is prepared using one of the techniques outlined in U.S. application Ser. Nos. 11/055,976; 11/330,291; 11/432,484; and 11/556,385; and U.S. Pat. Nos. 6,875,661, 7,094,651, and YOR820060196. The metal chalcogenide should be chosen so as to provide optimal electronic and optical characteristics for an absorber layer, including, for example, a band gap that provides for optimal absorption of solar radiation, a direct band gap to improve absorptivity, an electronic structure that minimizes the effect of grain boundaries. Generally, the process involves dissolving the suitably chosen metal chalcogenide in hydrazine (or a hydrazine-like solvent) at near ambient temperatures, with optionally extra chalcogen added to improve solubility. The solution can also be prepared by directly dissolving the corresponding metal of the metal chalcogenide in hydrazine, with at least enough chalcogen added to affect the formation and dissolution of the metal chalcogenide in solution (U.S. application Ser. No. 11/432,484). Alternatively, the solution can be formed by dissolving a preformed hydrazinium-based precursor in a non-hydrazine-based solvent, such as a mixture of ethanolamine and DMSO, as described in U.S. Pat. No. 7,094,651, the contents of which are incorporated herein by reference. In the cases of ternary, quaternary and compounds with more than four elements, it is sometimes preferable to dissolve each component separately and then combine the solutions before deposition.

(2) Metal chalcogenide precursor films are deposited using the solutions prepared in step 1 on a substrate to produce the absorber layer of the PV device using standard solution-based techniques such as spin-coating, stamping, printing, doctor blading, or dipping along with the other associated device layers shown in FIGS. 1 and 2. The substrate, which contains underlayers of the PV device (FIGS. 1 and 2), is typically used "as-is" with no further cleaning performed on the substrate after deposition of the previous layer of the device. The thickness of the deposited film can be controlled by properties of the solution used for deposition, such as concentration and viscosity of the solution, as well as properties of the deposition process (e.g., spin rpm).

(3) A moderately low-temperature thermal treatment is used to decompose the resulting metal chalcogenide precursor film on the substrate, resulting in the formation of a metal chalcogenide absorber layer that is relatively free from standard impurities (C, O, Cl, etc.). The thermal treatment is typically at a temperature from about 50° C. to about 600° C., but preferably from about 350° C. to about 550° C., and for a period of time sufficient to decompose the precursor and effect sufficient grain growth. Typically, the thermal treatment is for a period of from about 5 sec to about 10 hr, but preferably, the thermal treatment is for a period of from about 5 min to about 45 min. The thermal treatment can be applied using a hot plate, oven (tube- or box-type), laser-based rapid annealing or microwave-based heating.

Optionally, the process may be repeated at least one more time to deposit multiple layers of the same material to create a thicker layer or using different materials, compounds, or compositions, to produce a stack having the same or different layers of the same or different materials, or a film having a uniform or a graded composition.

Preferably, the absorber layer has a thickness of at least about 200 nm. Preferably, the coating step in the solution-based process is carried out using spin-coating, stamping, printing, doctor blading, spraying, or dipping.

In an effort to reduce fabrication costs and extend the range of substrates upon which CIGS devices can be integrated, there has been significant effort to develop lower-temperature, ultra low-cost solution-based approaches for the fabrication of the CIGS absorber layer for PV devices. Advantages of such solution-based approaches include:

(1) In the solution-based approaches, high vacuum conditions are not required. This is an advantage which reduces fabrication costs and renders the fabrication of large area devices much more convenient;

(2) The deposition processes are less energy intensive so that rather than needing to heat up sources to high temperature to evaporate the material or use large power supplies to sputter the materials onto a substrate, solutions of the materials, prepared at room temperature, can be simply solution-processed (e.g., spin coated, ink-jet printed, doctor bladed, stamped, dip coated) onto the substrate;

(3) Materials utilization efficiency is generally much higher for solution-based approaches so that rather than forming an evaporation plume in a vacuum chamber much of which would normally end up on a vacuum chamber wall, the solution-processed materials can be directed more precisely to where they are required, employing approaches such as ink-jet printing and stamping. High materials utilization efficiencies close to 100% are important in order to keep materials costs and processing wastes as small as possible;

(4) Solution-based approaches potentially have higher production throughput and are compatible with roll-to-roll and large area processing;

In addition, the present invention has the following advantages over previously disclosed solution-based deposition approaches to produce the absorber layers, as well as the devices based on such absorber layers:

(1) The present solution-based techniques do not involve oxygen or oxides and, as such, do not require an anneal in a chalcogen-containing atmosphere;

(2) Approaches involving the present molecular-based precursors which do not contain carbon, oxygen, or chlorine, do not produce films having substantial contamination by carbon, oxygen, or chlorine impurities that are commonly seen in pyrolytic processes;

(3) High-throughput solution-based approaches, such as, spin coating, printing, ink jet printing, spray coating, doctor blading, and dipping, are faster, cleaner and simpler than electrochemical approaches;

(4) The presentsolution-based techniques enable facile incorporation of dopants such as Al, Sb, Na, or Te, either in uniform or in a graded manner as desired;

(5) The present invention employs molecular precursors rather than nanoparticle precursors. This enables the formation of a true solution before solution-based thin-film deposition, thereby allowing for better mixing of the elements on a molecular scale and provides better grain growth at lower temperatures. The latter is particularly important for complex materials such as CIGS, which contains at least 4 elements;

(6) The present invention is simple to implement and, as such, permits one to tailor the chemical composition of the absorber layer by simply changing the ratio of elements in the solution or dissolving other elements, such as, Ga, Na, and Sb, into the deposition solution. Such incorporation facilitates grain growth and optimization of the absorber layer and can improve the electrical characteristics of the device;

(11) The precursor and solution of the present invention employ only the metal chalcogenide, chalcogen and hydrazine (or a hydrazine-like compound), thereby eliminating many sources for potential film impurities, including carbon, oxygen, halides, etc.; and

(12) The present process is very simple and potentially very low cost. No vacuum-based treatments or depositions are required. There is also no need to carefully prepare nanoparticles prior to the fabrication. Thus, all that is required is to carry out the following steps or their equivalents:

(a) dissolving the component metal chalcogenides into a solution which is generally carried out at room temperature;

(b) depositing the solutions onto the substrate using a technique such as spin coating, doctor blading, printing, ink jetting, stamping, etc., to produce a precursor film; and (c) performing a rapid thermal treatment in an inert atmosphere.

There is no need to provide a chalcogen source, such as, a selenium source in this process, although such can be employed if desired.

Several examples of the improved absorber layer are described below, including deposition of CIGS films on Mo-coated glass substrates.

CIGS, which refers to the compound $CuIn_{1-x}Ga_xSe_2$, with $0 \leq x \leq 1$, is in many ways an ideal absorber layer. It offers a direct band gap, which is tunable through the parameter "x" from about 1.0-1.65 eV (see, for example, B. J. Stanbery, *Critical Reviews in Solid State and Materials Science*, vol. 27, 73-117, 2002). Additional flexibility can be obtained using compounds of the general chemical formula $Cu_{1-y}In_{1-x}Ga_xSe_{2-z}S_z$, wherein $0 \leq x \leq 1$, $0 \leq y \leq 0.15$ and $0 \leq z \leq 2$.

A direct band gap is important for minimizing the materials requirements for the cell. A crystalline Si (indirect band gap) cell requires a 100-µm-thick layer in order to absorb 90% of the incident solar radiation. Direct band gap systems can require as little as about 1 µm-thick films for the same absorption characteristics. In addition, grain boundaries do not degrade electronic properties for CIGS absorber layers as much as for other absorber material candidates. Vacuum-deposited polycrystalline CIGS absorber layers have led to device efficiencies >19% in laboratory-scale devices. Given these attributes, CIGS was chosen to demonstrate the current invention.

Several issues must be addressed in the deposition of the CIGS absorber layers. These are outlined below:

(1) films of the PV absorber layers preferably should be relatively thick (about µm length scale), whereas the solution-processed films prepared for TFT (thin-film transistor) applications described in previous disclosures, such as, U.S. Pat. Nos. 6,875,661 and 7,094,651, can be ultrathin (about nm length scale);

(2) doping with Ga needs to be achieved in a homogeneous and/or graded fashion to optimize the bandgap profile in the absorber layer to minimize recombination; and (3) large grain structure needs to be achieved, to minimize recombination at the grain boundaries.

The following examples address these issues and demonstrate an absorber layer which has superior grain structure and compositional control, as well as a photovoltaic device that is lower cost compared with devices known in the art in which the absorber layer is deposited using other solution-based approaches.

EXAMPLE 1

The solutions used for the thin-film deposition were prepared in an inert atmosphere in two steps. First, solutions for each of the individual component metal chalcogenides were prepared, all at room temperature, and then the component solutions were mixed in the appropriate ratios to yield a stoichiometric solution for the targeted overall CIGS composition.

Component solution (a) contained 4 mmol $In_2Se_3$ (1.886 g) and 4 mmol Se (0.316 g) dissolved in 12 mL of anhydrous hydrazine. After several days a clear pale yellow and very viscous solution formed. Solution (b) contained 1.5 mmol Ga (0.105 g; ground up) and 3 mmol of Se (0.237 g) dissolved in 3 mL of anhydrous hydrazine (after a week of stirring). Solution (c) contained 4 mmol $Cu_2S$ (0.637 g) and 8 mmol S (0.256 g) dissolved in 8 mL of anhydrous hydrazine, forming a clear yellow solution. Solution (d) contained 4 mmol Se (0.316 g) dissolved in 2 mL of hydrazine.

From these initial component solutions, 3 CIGS solutions were prepared and stirred for about 12 hrs before spin coating:

Solution A (targeting a CuInSe$_2$ stoichiometry, x=0) was prepared by mixing 0.6 mL of solution (c) (containing 0.6 mmol of Cu), 0.9 mL of solution (a) (containing 0.6 mmol In), 0.12 mL solution (d) (containing 0.24 mmol Se) and 0.21 mL hydrazine.

Solution B (targeting a CuIn$_{0.85}$Ga$_{0.15}$Se$_2$ stoichiometry, x=0.15) was prepared by mixing 0.8 mL of solution (c) (containing 0.8 mmol of Cu), 1.0 mL of solution (a) (containing 0.68 mmol In), 0.24 mL of solution (b) (containing 0.12 mmol of Ga), 0.16 mL solution (d) (containing 0.32 mmol Se) and 0.22 mL hydrazine.

Solution C (targeting a CuIn$_{0.7}$Ga$_{0.3}$Se$_2$ stoichiometry, x=0.3) was prepared by mixing 4.0 mL of solution (c) (containing 4.0 mmol of Cu), 4.2 mL of solution (a) (containing 2.8 mmol In), 2.4 mL of solution (b) (containing 1.2 mmol of Ga), 0.8 mL solution (d) (containing 1.6 mmol Se) and 0.8 mL hydrazine.

For each of these solutions, an excess of Se was added to improve grain growth and reduce the content of residual S in the final films (from the Cu$_2$S precursor solution). Cu$_2$S was used rather than Cu$_2$Se because of the better solubility of Cu$_2$S.

Having achieved a stable solution of CIGS with various Ga contents, a number of different solution-processing techniques could be used to deposit the precursor films (e.g., dip coating, stamping, and printing).

In this example, the precursor film was produced by spin coating. The spin-coating process involves depositing several drops of the precursor solution on the 1"×1" square glass substrate, which is coated with 100 nm of Mo deposited by sputtering, and initiating the spinning cycle after ensuring that the drops have spread sufficiently to cover approximately the entire substrate. The spin cycle includes ramping to 150 rpm for 7 seconds and then ramping in 3 seconds to 900 rpm and maintaining at that level of rotation for 100 seconds.

After depositing the precursor film, the coated substrates were first placed on a hot plate in an inert atmosphere at 80° C. for 10 minutes as a drying step and then at a final temperature of about 350° C. to about 500° C. for 15 minutes. The substrate was then removed from the hotplate and cooled to room temperature.

The coating process was repeated multiple times to build up thickness. In the successive depositions, no drying step was used. Instead, the substrates were immediately heated to the final temperature.

RBS (Rutherford Backscattering) and PIXE (particle-induced X-ray emission) analysis of an analogous film prepared on a silicon substrate (with thermal oxide coating) and using one coating of the CIGS material was generally used to examine the stoichiometry of the films. Also, X-ray powder diffraction and cross-sectional SEM images were used to evaluate phase purity and grain size in the resulting films on glass/Mo.

RBS/PIXE analysis results for films formed from each solution are shown below and are in agreement with the targeted film composition. Thus, the expected compositions would have 25% Cu, 25% In, 50% Se for Solution A samples; 25% Cu, 21.2% In, 3.8% Ga, 50% Se for Solution B samples; and 25% Cu, 17.5% In, 7.5% Ga, 50% Se for solution C samples. All films received a final heat treatment at 425° C. Table 1 summarizes these RBS/PIXE results. The numbers in parentheses indicate the error in the last digit.

TABLE 1

| | Cu | In | Ga | Se |
|---|---|---|---|---|
| Solution A (x = 0) | 26.6 (10) | 24.1 (10) | — | 45.7 (10) |
| Solution B (x = 0.15)* | 24.7 (5) | 19.6 (5) | 3.6 (5) | 52.1 (5) |
| Solution C (x = 0.3) | 25.0 (5) | 19.1 (5) | 6.9 (5) | 49.0 (5) |

*For sample B, the RBS/PIXE analysis was performed on a thick (6 deposition) film on glass/Mo, rather than for a sample on Si/SiO$_2$ with a single coating.

There is a small quantity of S detected in the films (2-8% relative to the other components). This value, which is represented by "z" in the formula CuIn$_{1-x}$Ga$_x$Se$_{2-z}$S$_z$, can be controlled by controlling the amount of excess Se or S added to the reaction, controlling the final anneal temperature, and/or controlling the duration of the annealing step. On the other hand, incorporation of S can be potentially useful for tailoring the bandgap of the film.

RBS/PIXE analysis was also performed for films with x=0.3 and final anneal temperature ranging from about 350° C. to about 500° C.

Table 2 summarizes these results. The numbers in parentheses indicate the error in the last digit.

TABLE 2

| | Cu | In | Ga | Se |
|---|---|---|---|---|
| Solution C (x = 0.3, 350 C.) | 25.0 (5) | 19.1 (5) | 6.9 (5) | 49.0 (5) |
| Solution C (x = 0.3, 425 C.) | 25.8 (5) | 18.1 (5) | 7.2 (5) | 48.9 (5) |
| Solution C (x = 0.3, 500 C.) | 26.4 (5) | 18.8 (5) | 6.9 (5) | 47.9 (5) |

The film stoichiometries for films deposited at 350° C. versus the films deposited at 500° C. are essentially the same to within experimental uncertainty, although there may be a slight reduction in Se content for the films annealed at higher temperature.

Figure 3:
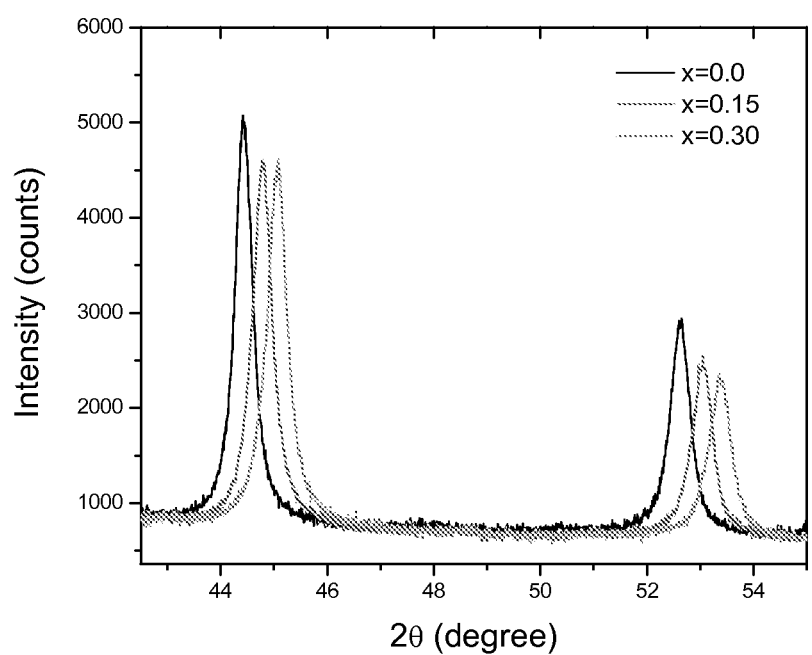
FIG. 3 shows X-ray powder diffraction patterns (Cu Kα radiation) for $CuIn_{1-x}Ga_xSe_2$ films with x=0.0, 0.15 and x=0.3 for a final anneal temperature of 425° C. The reflections shown are the (220)/(204) and (312)/(116) reflections.

FIG. 3 shows X-ray powder diffraction patterns (Cu Kα radiation) for CuIn$_{1-x}$Ga$_x$Se$_2$ films with x=0.0, 0.15 and x=0.3 for a final anneal temperature of about 425° C. The reflections shown are the (220)/(204) and (312)/(116) reflections. The X-ray diffraction data are for films prepared from solutions A, B and C, on glass, with 100 nm Mo layer on top, using 6 successive deposition cycles and a final heat treatment at 425° C. The films are about 1 μm thick.

The continuous shift in the X-ray reflections toward higher values of 2θ as the smaller Ga atom replaces larger In, is consistent with a smaller unit cell size. The shift in 2θ, coupled with the absence of significant peak broadening, indicates that the Ga is substituting uniformly for In throughout the CIGS films.

Figure 4:
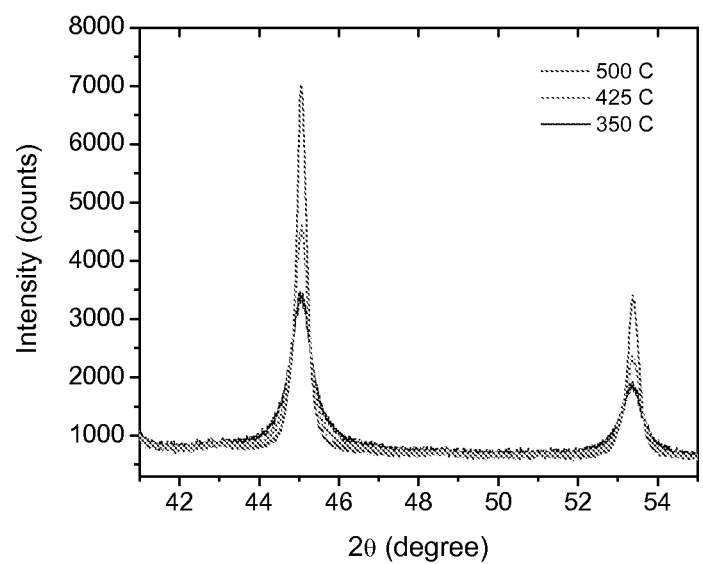
FIG. 4 shows the X-ray diffraction patterns for a solution C film formed on glass, using 6 deposition cycles and a final anneal at either 350° C., 425° C. or 500° C.

FIG. 4 shows X-ray powder diffraction patterns (Cu Kα radiation) for CuIn$_{1-x}$Ga$_x$Se$_2$ films with x=0.3 and for a final anneal temperature of 350° C., 425° C. and 500C. The reflections shown are the (220)/(204) and (312)/(116) reflections. Referring to FIG. 4, the X-ray diffraction patterns is for a solution C film formed on glass, using 6 deposition cycles and final annealing at either 350° C., 425° C., or 500° C. Clearly, crystalline CIGS is formed by 350° C. However, better crystallinity is obtained when the annealing temperatures are higher.

Grading of the Ga content in the film has also been demonstrated. Rather than using 6 depositions of the same solution followed by a thermal treatment, this was carried out using two depositions of solution C, two depositions of Solution B and two depositions of solution A successively for the same film. Final anneals were carried out at 425° C. for 15 min in both graded and ungraded cases.

Figure 5:
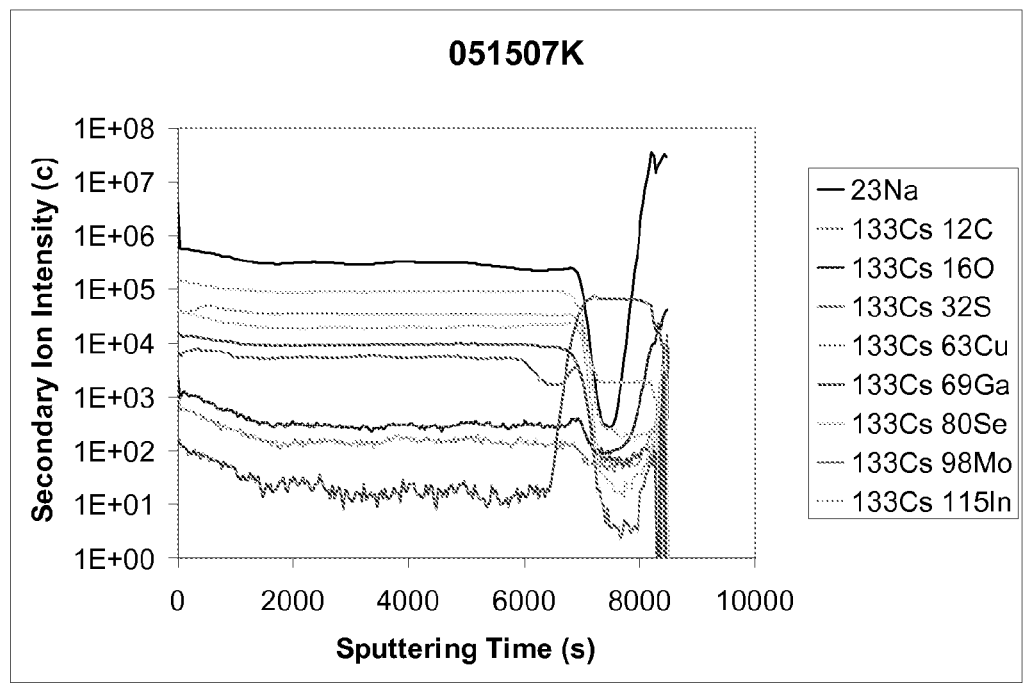
FIG. 5 shows a SIMS depth profile for a solution-processed CIGS film on glass/Mo, prepared using Solution B (x=0.15) for 6 successive depositions. The SIM profile examines Na (from glass), Cu, Ga, Se, In, Mo, C and O composition. Note uniform Ga concentration.

FIG. 5 shows the SIMS depth profile for a solution-processed CIGS film on glass/Mo, prepared using Solution B (x=0.15) for 6 successive depositions. The SIM profile examines Na (from glass), Cu, Ga, Se, In, Mo, C and O composition. Note the uniform Ga concentration.

Figure 6:
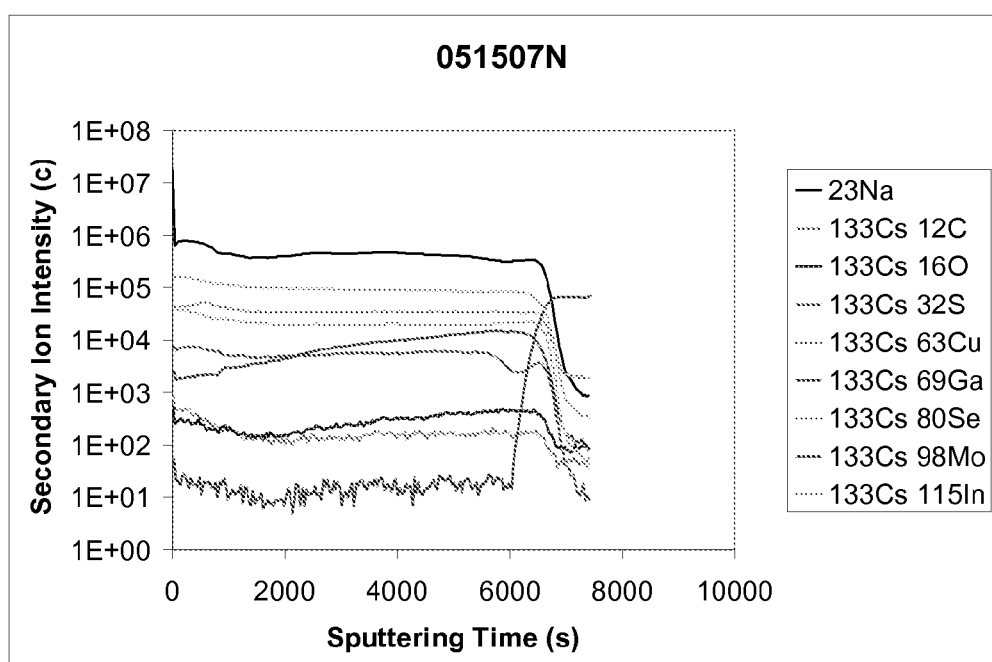
FIG. 6 shows a SIMS depth profile for a solution-processed CIGS film on glass/Mo, prepared using Solution A (x=0.0) for 2 depositions, Solution B (x=0.15) for 2 depositions and Solution C (x=0.3) for 2 depositions. The SIM profile examines Na (from glass), Cu, Ga, Se, In, Mo, C and O composition. Note the graded Ga concentration.

FIG. 6 shows the SIMS depth profile for a solution-processed CIGS film on glass/Mo, prepared using Solution A (x=0.0) for 2 depositions, Solution B (x=0.15) for 2 depositions and Solution C (x=0.3) for 2 depositions. The SIM profile examines Na (from glass), Cu, Ga, Se, In, Mo, C and O composition. Note the graded Ga concentration.

Referring to FIGS. 5 and 6, Secondary Ion Mass Spectroscopy (SIMS) results as a function of sputter time (depth into film) are shown for ungraded and graded CIGS films, respectively. From these results one can evaluate the composition as a function of depth. There is clear evidence of Ga grading in the film prepared from three distinct solutions, which clearly demonstrates that grading of the composition of the absorber layer, which is a valuable tool in PV applications, can be easily achieved according to the method of the present invention.

Figure 7:
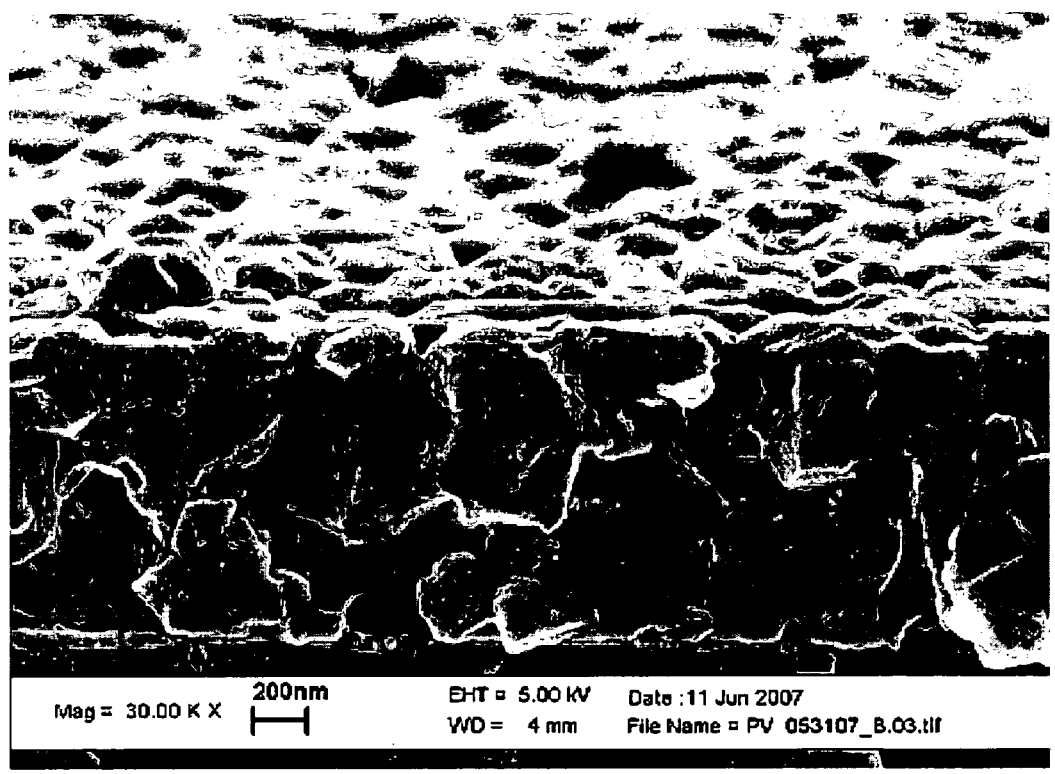
FIG. 7 is a cross-sectional SEM image of an x=0.3 CIGS films, prepared using solution C and 7 depositions on a glass/Mo substrate.

FIG. 7 is a cross-sectional SEM image of an x=0.3 CIGS films, prepared using solution C and 7 depositions on a glass/Mo substrate. The final heat treatment temperature was 500° C. for 20 min. Additionally, for these films, the intermediate heat treatments (for the 6 depositions before the last one) were performed at 300° C.

Figure 8:
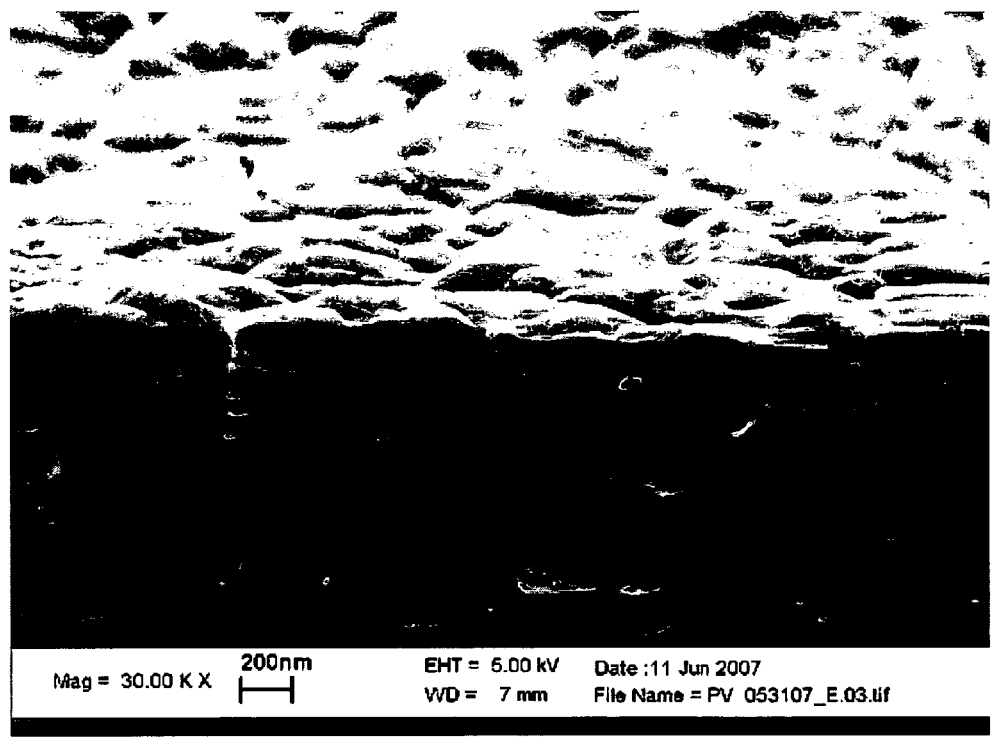
FIG. 8 is a cross-sectional SEM image of an x=0.3 CIGS films, prepared using solution C and 7 depositions on a glass/Mo substrate.

FIG. 8 is a cross-sectional SEM image of an x=0.3 CIGS films, prepared using solution C and 7 depositions on a glass/Mo substrate. The final heat treatment temperature was 500° C. (Annealed for 60 min rather than for 20 min). Additionally, for these films, the intermediate heat treatments (for the 6 depositions before the last one) were performed at 300° C.

Figure 9:
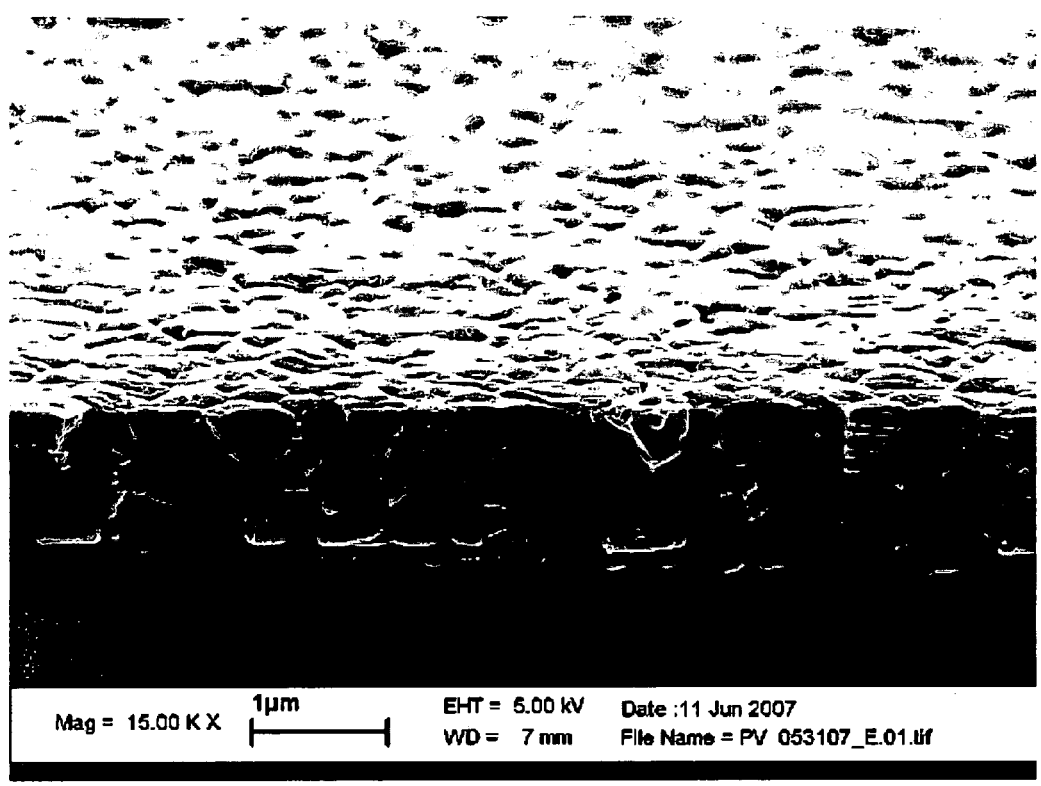
FIG. 9 is a cross-sectional SEM image of an x=0.3 CIGS films, prepared using solution C and 7 depositions on a glass/Mo substrate.

FIG. 9 is a cross-sectional SEM image of an x=0.3 CIGS films, prepared using solution C and 7 depositions on a glass/Mo substrate. The final heat treatment temperature was 500° C., annealed for 60 min rather than for 20 min. Additionally, for these films, the intermediate heat treatments (for the 6 depositions before the last one) were performed at 300° C.

Referring to FIGS. 7, 8, and 9, cross-sectional Scanning Electron Microscope (SEM) images of CIGS films deposited using the method of the present invention are shown. In each case, the film was deposited on Mo-coated glass with 100 nm of Mo deposited by sputtering. Grain sizes of order 0.2-2 μm appear to be readily achievable using this approach using a relatively quick heat treatment without using any selenium-containing gases, with all heat treatments being performed in the same nitrogen-filled drybox as that used for spin-coating.

Note that these do not represent optimized grain structures or processing conditions. Thus, even better grain structures can be achieved, even at a lower temperature, by optimizing the stoichiometry of the spin-coating solution, introducing selected impurities (see example 2) and tailoring the heat treatment profile to produce better grain structures.

The films described above are ideally suited for use in the PV device structures shown in FIG. 1.

EXAMPLE 2

Grain structure control is achieved using a small amount of included Sb doping (from $CuSbS_2$). The solutions used for the film depositions were prepared in a similar fashion to that described in example 1, with the exception of mixing in a small quantity (<1 atomic %) of $CuSbS_2$ solutions during the second step. In addition, the example here considers $CuInSe_2$ as the target system instead of $Cu(In,Ga)Se_2$. However, similar effects of Sb-inclusion on grain structure for the Ga-containing system has also been observed.

Component solution (a) containing 3 mmol $In_2Se_3$ (1.3996 g) and 3 mmol Se (0.237 g) dissolved in 9 mL of anhydrous hydrazine. After several days, a clear pale yellow and very viscous solution formed. Solution (b) contained 4 mmol $Cu_2S$ (0.637 g) and 8 mmol S (0.256 g) dissolved in 8 mL of anhydrous hydrazine, forming a clear yellow solution. Solution (c) contained 4 mmol Se (0.316 g) dissolved in 2 mL of hydrazine. Solution (d) c contained 4 mmol $Sb_2S_3$ (1.359 g) and 8 mmol S (0.256 g) dissolved in 8 mL of anhydrous hydrazine, forming a clear bright yellow solution.

Three solutions were prepared from these initial component solutions, and allowed to stir for about 12 hrs at room temperature before spin coating:

Solution A (targeting a $CuInSe_2$ stoichiometry, undoped) was prepared by mixing 1.5 mL of solution (a) (containing 1.0 mmol of In), 1.0 mL of solution (b) (containing 1.0 mmol Cu), 0.2 mL solution (c) (containing 0.4 mmol Se) and 0.38 mL hydrazine.

Solution B (targeting a 0.75 mol % Sb doped $CuInSe_2$) was prepared by mixing 1.5 mL of solution (a) (containing 1.0 mmol of In), 1.0 mL of solution (b) (containing 1.0 mmol Cu), 0.2 mL solution (c) (containing 0.4 mmol Se), 7.5 μL solution (b) (containing $7.5 \times 10^{-3}$ mmol Cu), 7.5 μL solution (d) (containing $7.5 \times 10^{-3}$ mmol Sb), and 0.38 mL hydrazine.

Solution C (targeting a 1.0 mol % Sb doped $CuInSe_2$) was prepared by mixing 1.5 mL of solution (a) (containing 1.0 mmol of In), 1.0 mL of solution (b) (containing 1.0 mmol Cu), 0.2 mL solution (c) (containing 0.4 mmol Se), 10 μL solution (b) (containing 0.01 mmol Cu), 10 μL solution (d) (containing 0.01 mmol Sb), and 0.38 mL hydrazine.

The films were deposited in an inert atmosphere by spin coating using the as-described solutions. The substrates used were 1"×1" square glass substrates coated with 100 nm of Mo. The spin cycle includes ramping to 800 rpm in less than 1 second and maintaining this rotation for 100 seconds.

After deposition of the precursor film, the coated substrates were first placed on a hot plate (in an inert atmosphere) at 280° C. for 10 minutes as a decomposition step to form $CuInSe_2$, perhaps with still some extra Se incorporated, which is removed after the final heat treatment. The substrate was then removed from the hotplate and cooled to room temperature.

The coating process was repeated multiple times to build up thickness. In the successive depositions, the same annealing parameters (280° C. for 10 minutes) were employed between each layer (the top layer was subjected to this treatment as well before the final anneal was applied). Then the substrates were heated at 375° C. for 20 minutes as a final anneal. X-ray powder diffraction and cross-sectional SEM images were used to evaluate phase purity and grain size in the resulting films on glass/Mo.

Figure 10:
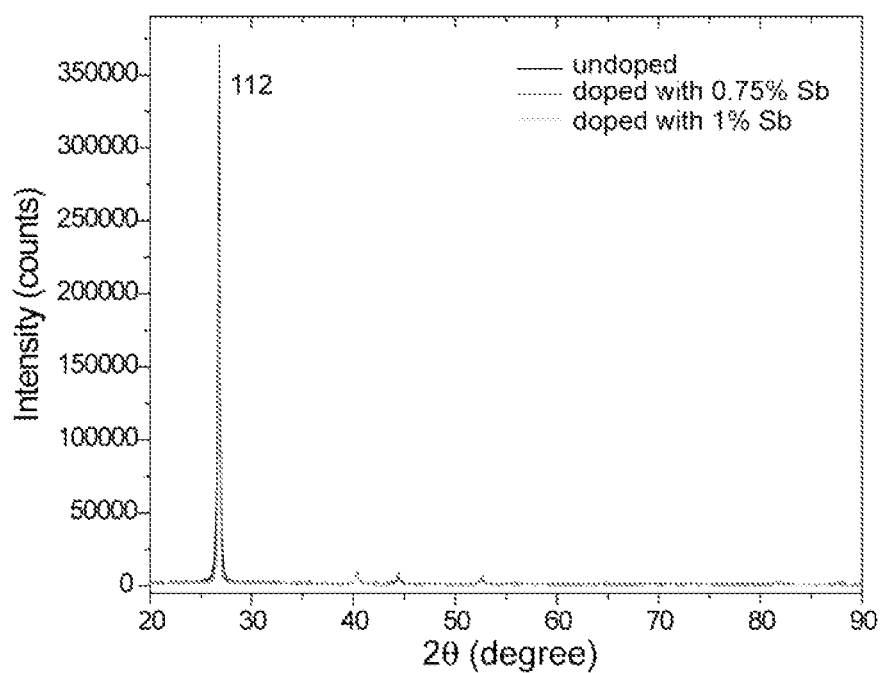
FIG. 10 shows X-ray powder diffraction patterns (Cu Kα radiation) for Sb-treated (0.75 mol % and 1 mol %) and untreated $CuInSe_2$ films.
Figure 11:
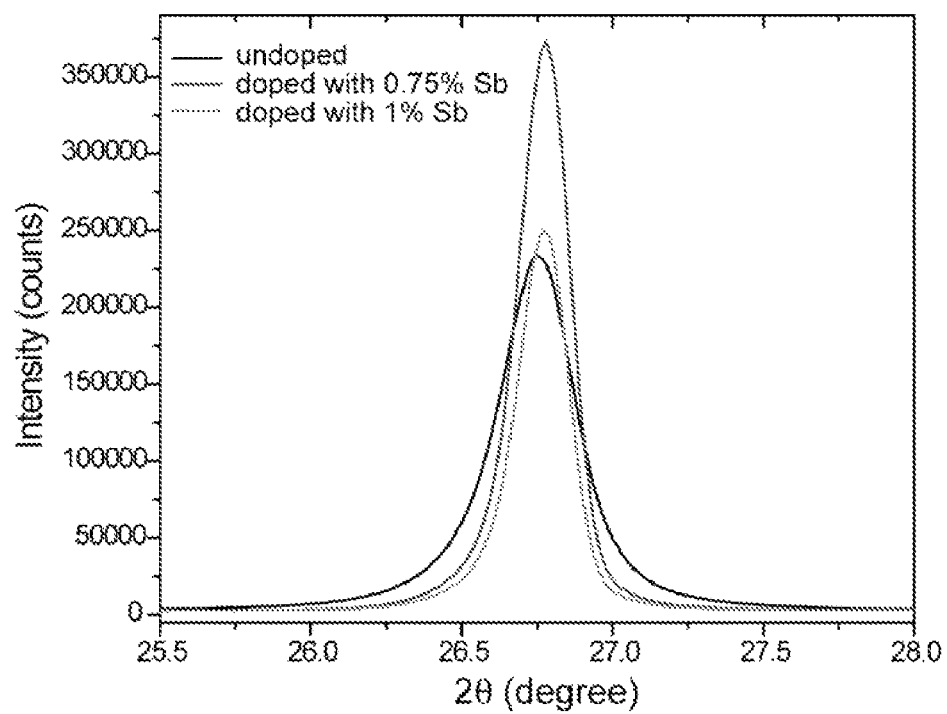
FIG. 11 is a comparison of the (112) diffraction peak for Sb-treated (0.75 mol % and 1 mol %) and untreated $CuInSe_2$ films.
Figure 12:
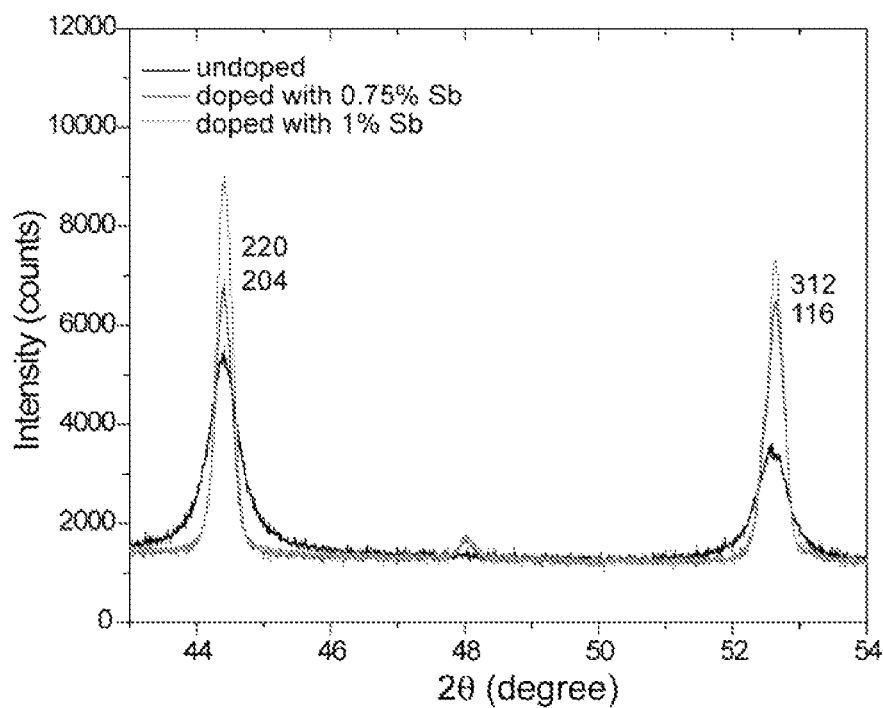
FIG. 12 is a comparison of the higher angle diffraction peaks for Sb-treated (0.75 mol % and 1 mol %) and untreated $CuInSe_2$ films.

Below are X-ray diffraction data for films prepared from solutions A, B and C, on glass (with 100 nm Mo layer on top), using 5 successive deposition cycles and a final heat treatment at 375° C. (FIGS. 10, 11 and 12). The films were about 800 nm thick. Note that all three patterns showed the preferential orientation of the films along the 112 direction, and that all peaks could be indexed to the body-centered tetragonal $CuInSe_2$ (the chalcopyrite) phase.

Referring to FIG. 10, X-ray powder diffraction patterns (Cu Kα radiation) for Sb-treated (0.75 mol % and 1 mol %) and untreated $CuInSe_2$ films are shown. The films were annealed at a final temperature of 375° C. for 20 minutes. All three films showed strong preferential orientation along the (112) direction.

FIG. 11 is a comparison of the (112) diffraction peak for Sb-treated (0.75 mol % and 1 mol %) and untreated CuInSe$_2$ films. The peak gets narrower with increasing amount of Sb inclusion, indicating improved crystallinity of the films.

FIG. 12 is a comparison of the higher angle diffraction peaks for Sb-treated (0.75 mol % and 1 mol %) and untreated CuInSe$_2$ films. The peaks get narrower with increasing amount of Sb inclusion, as seen in peak (112), and the preferential orientations of the films also get stronger along the (220)/(204) and (312)/(116) directions with increasing amount of Sb doping.

Referring to FIGS. 11 and 12 show changes in full width at half maximum (FWHM) and peak intensity of the diffraction patterns of the three films. The diffraction peaks grow unambiguously narrower with increasing amount of Sb inclusion, indicating improved crystallinity of the films as a function of Sb-inclusion level. Also note the films showed stronger preferential orientation along the (220)/(204) and (312)/(116) directions at higher Sb inclusion levels.

Figure 13:
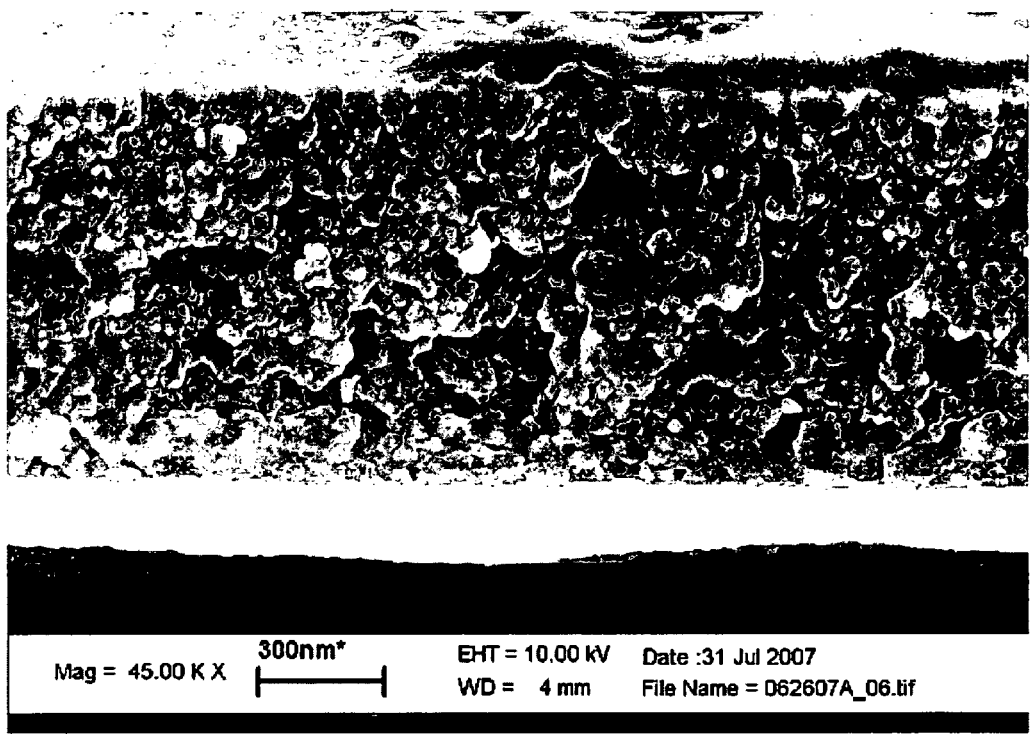
FIG. 13 is a cross-sectional SEM image of the untreated (or undoped) CIS film, prepared using solution A and 5 depositions on a glass/Mo substrate.

FIG. 13 is a cross-sectional SEM image of the untreated (or undoped) CIS film, prepared using solution A and 5 depositions on a glass/Mo substrate. The final heat treatment temperature was 375° C. (annealed for 20 minutes). Additionally, for these films, the intermediate heat treatments (for all five depositions including the last one) were performed at 280° C.

Figure 14:
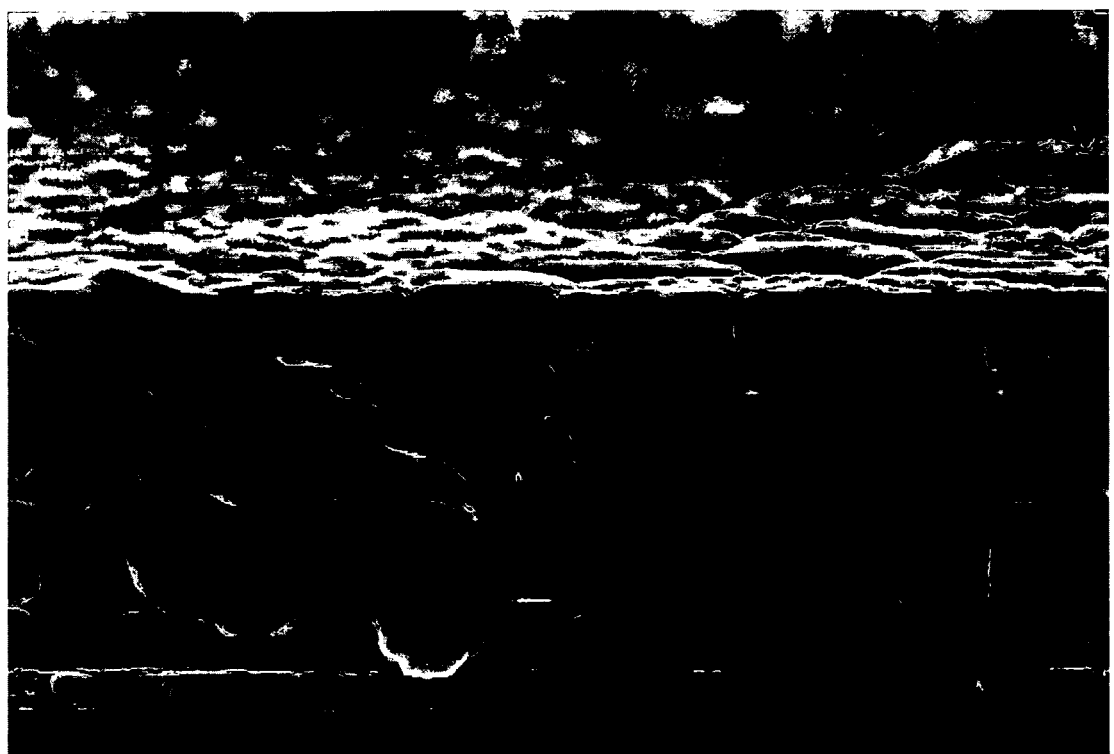
FIG. 14 is a cross-sectional SEM image of the 0.75 mol % Sb-treated CIS film, prepared using solution B and 5 depositions on a glass/Mo substrate.

FIG. 14 is a cross-sectional SEM image of the 0.75 mol % Sb-treated CIS film, prepared using solution B and 5 depositions on a glass/Mo substrate. The final heat treatment temperature was 375° C. (annealed for 20 minutes). Additionally, for these films, the intermediate heat treatments (for all five depositions including the last one) were performed at 280° C.

Figure 15:
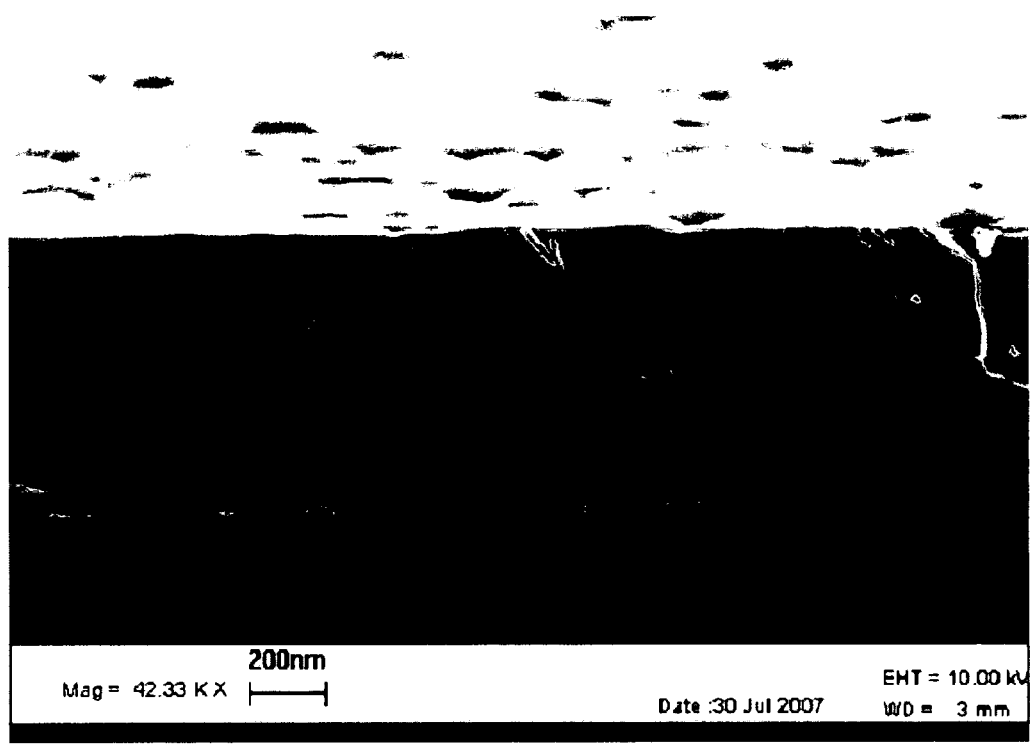
FIG. 15 is a cross-sectional SEM image of the 1.0 mol % Sb-treated CIS film, prepared using solution C and 5 depositions on a glass/Mo substrate.

FIG. 15 is a cross-sectional SEM image of the 1.0 mol % Sb-treated CIS film, prepared using solution C and 5 depositions on a glass/Mo substrate. The final heat treatment temperature was 375° C. (annealed for 20 minutes). Additionally, for these films, the intermediate heat treatments (for all five depositions including the last one) were performed at 280° C.

Referring to FIGS. 13-15, the cross-sectional scanning electron microscope (SEM) images of Sb-treated and untreated CIS films that are deposited using the above described approach are depicted. In each of these cases, the films were deposited on Mo-coated glass (i.e, with 100 nm of Mo deposited by sputtering).

All heat treatments were performed in the same nitrogen-filled drybox as that used for spin-coating. Note the clearly evident grain size improvements upon the inclusion of a very small amount (0.75 mol %) of Sb. Grain sizes of μm order appear to be readily achievable using this Sb-doping approach at a rather low annealing temperature (375° C.) and for a relatively short period of time (20 minutes).

There are a few previous reports about the Sb-doping effects on CuInSe$_2$ films using traditional vacuum-based techniques, including, for example, films grown either by molecular beam deposition (see, for example, B. -H. Tseng et al., *Jpn. J. Appl. Phys.* vol. 34, 1109-1112, 1995) or by laser ablation (see, for example, S. Kuranouchi et al., *2$^{nd}$ World Conference and Exhibition on Photovoltaic Solar Energy Conversion*, July 6-10, 612-615, 1998).

Sb-doping was achieved either through Sb-beam flux in the former case or by introduction of Sb$_2$Se$_3$ powder in the CIS target in the latter case. In the molecular beam deposited films, the Sb-inclusion was of trace amount and could only be detected by SIMS. Furthermore, the Sb-content was highest near the surface but decreased dramatically away from the surface. Thus, it was concluded that Sb was acting as a surfactant on the growth of the CuInSe$_2$ film leading to a smoother surface and a more compact grain structure.

In the laser-ablated CIS films, the Sb-content in the target was varied from 0 to 30 mol %. Again the actual Sb-inclusion in the films was minimal and could only be detected by SIMS. Interestingly, the doped Sb atoms were found to be distributed homogenously in the films, as opposed to the surface segregation of Sb atoms observed by the molecular beam deposited films. It was concluded in this case that the grain size and crystallinity of the films were not dependent on the Sb content in the films.

The present solution-based process enables convenient Sb-inclusion in the final CIS films in a continuous and controllable manner. The solution-based approach is a much more precise way to control the actual Sb-inclusion level in the films as compared to the vacuum-based techniques, where the Sb-concentrations in the films were minimal and did not vary much despite the Sb-content in the target being varied from 0-30 mol %.

In the present approach, the Sb-inclusion level in the films can be tailored by changing the amount of Sb$_2$S$_3$ solution mixed in during the second step of the solution preparation process. Thus, films of increasing Sb-concentrations can be prepared with ease and the grain size enhancement effects can be studied in a gradual manner, as depicted in FIGS. 13-15.

This dramatic effect on the grain size growth of the CIGS system, induced by a very small amount of Sb-doping, was not discussed in any of the previous Sb-doping reports. Initial results according to the present invention suggest that the minimum Sb-inclusion level for the grain size improvement effect is largely determined by the heat annealing temperature. A higher annealing temperature generally requires a lower minimum Sb-inclusion level to achieve significant grain size enhancement, whereas a lower annealing temperature would require a higher minimum Sb-inclusion level. For example, only about 0.5 atomic % Sb-doping was needed to achieve grain size enhancement for a 400° C. heat treatment, whereas about 1 atomic % Sb-doping was required for a 350° C. heat annealing process.

These results do not represent optimized grain structures or processing conditions. Accordingly, even lower processing temperatures can be used to achieve grain structures suitable for actual device incorporation using this impurity-inclusion approach, and that by simultaneously optimizing other processing conditions, such as, the film stoichiometry of the spin-coating solution, heating profile and selective impurity introductions, better grain structures can be achieved for improved device performance.

EXAMPLE 3

The CIGS absorber layers described above were incorporated into a working PV device of the general structure outlined in FIG. 1, with, however, the CIGS absorber layer deposited using the method of the present invention.

A 1"×1" soda-lime glass plate (0.04" thickness) with about 900 nm of Mo sputtered on top formed the back contact of the device.

For each component solution, the solid components were weighed and the solutions were formed in a nitrogen-filled glove box with water and oxygen levels maintained below 1 ppm.

The component solutions for the CIGS layer were formed as follows:

Solution A (Cu$_2$S) was formed by mixing 6 mmol Cu$_2$S (0.955 g), 12 mmol S (0.3848 g) and 12.0 mL of anhydrous hydrazine (Aldrich, anhydrous, 98%), leading to a clear yellow solution after several days of stirring.

Solution B (In$_2$Se$_3$) was formed by mixing 4 mmol In$_2$Se$_3$ (1.8661 g), 4 mmol Se (0.3158 g) and 12.0 mL hydrazine (Aldrich, anhydrous, 98%), yielding a viscous pale yellow solution.

Solution C (Ga$_2$Se$_3$) was formed by mixing 6 mmol Ga (418.3 mg) and 12 mmol Se (947.5 mg) in 12 mL of hydrazine (Aldrich, anhydrous, 98%). To facilitate the dissolution of Ga, solution C was sonicated for 20-30 min before being left to stir. After 1 week of stirring, essentially all the original Ga had dissolved, yielding a colorless solution, with generally a very small amount of undissolved material remaining at the end of this process.

Solution D contained 12 mmol Se (947.5 mg) in 6.0 mL of hydrazine (Aldrich, anhydrous, 98%), forming a darkly colored solution.

The targeted Cu$_{1-y}$In$_{1-x}$Ga$_x$Se$_{2-z}$S$_z$ film with y=0, x=0.3, z about 0 was formed from a solution containing 5.0 mL sol. A (5.0 mmol Cu), 5.2 mL sol. B (3.5 mmol In), 3.0 mL sol. C (1.5 mmol Ga), 1.0 mL sol. D (2.0 mmol Se) and 2.25 mL hydrazine (Aldrich, anhydrous, 98%). Using this solution, a film of CIGS precursor was spin coated (800 rpm, 90 sec) onto the glass/Mo substrate. The film was dried and partially decomposed using a short (5 min.) treatment at 290 C in an inert atmosphere. Seven additional CIGS layers were deposited in the same way to build up film thickness, after which the film was subjected to a final heat treatment at 450 C for 20 min, thereby yielding a CIGS film with composition Cu(24.2%), In(16.7%), Ga(6.7%), Se(47.6%), S(4.8%), as determined by RBS, and a thickness of about 1.3 µm.

The CdS layer (about 50 nm thick) was deposited using a standard chemical bath deposition approach similar to that described in M. A. Contreras et al., "Optimization of CBD CdS process in high efficiency Cu(In,Ga)Se$_2$-based solar cells," Thin Solid Films, Vol. 403-404, 204-211 (2002). Approximately 50 nm of high resistivity intrinsic ZnO was sputtered onto the CdS. A conducting ITO layer was deposited to form the nominally transparent top contact using a sputtering technique and targeting a thickness of 350 nm. A Ni (50 nm)/Al (2 µm) grid was e-beam evaporated through a shadow mask. The processing steps from CdS deposition through Ni/Al layers are well known in the field. However, the deposition of the CIGS absorber layer using solution based deposition techniques is novel and produces unexpectedly superior results, such as, superior cost/performance characteristics, when compared with analogous approaches known in the art.

Figure 16A:
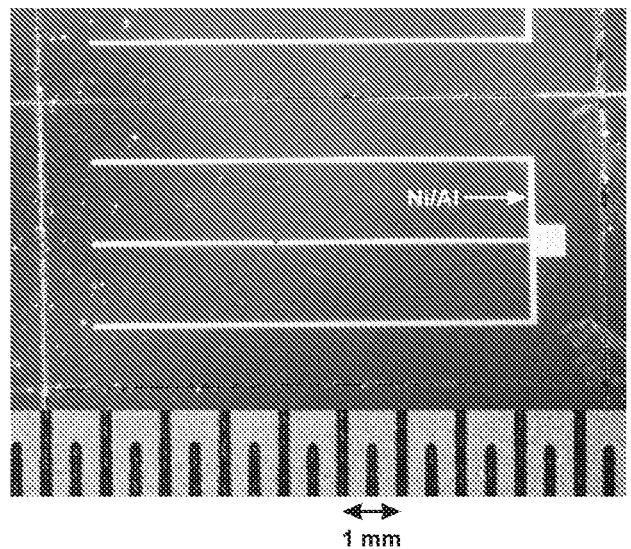
FIGS. 16a and 16b show, respectively, a top-view and cross sectional SEM image of a PV device having a solution-processed CIGS absorber layer prepared according to the present invention.
Figure 16B:
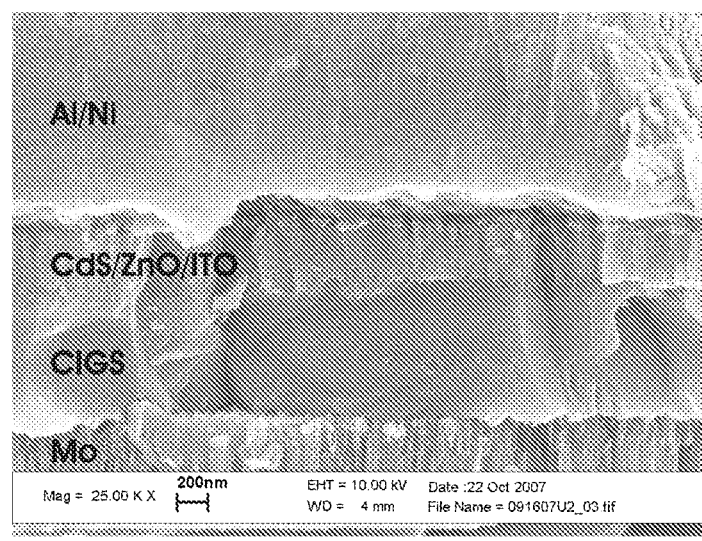

The figures below show a top down image and a cross section of one device substrate showing the different layers:

Referring to FIGS. 16*a* and 16*b*, a top-view and cross sectional SEM image of a PV device, respectively, are shown. The PV device has a solution-processed CIGS absorber layer prepared according to the present invention. The electrical characteristics for this unoptimized device are described below.

Figure 17:
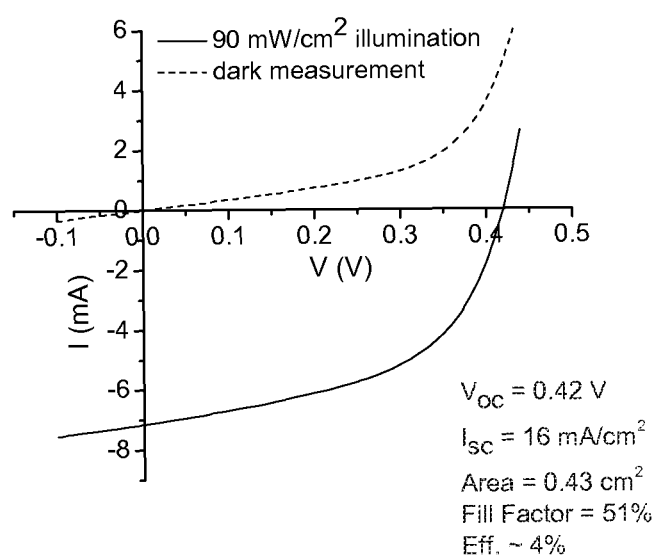
FIG. 17 shows the Current (I) versus Voltage (V) curve across the device structure of FIG. 16.

Referring to FIG. 17, the Current (I) versus Voltage (V) curve across the device structure of FIG. 16 is shown. The dashed line corresponds to a measurement made in the dark and the solid curve corresponds to a measurement made under illumination. Despite having not optimized the various layers of the device for high-performance, it is clearly seen that the present invention has already achieved an efficiency of 4%.

EXAMPLE 4

The solution-processed CIGS absorber layers described above were incorporated into a second example of a working PV device of the general structure outlined in FIG. 1 and as discussed in Example 3.

The main differences with Example 3 are: (1) the deposition solution was slightly Cu-deficient relative to the ideal Cu(In$_{0.7}$Ga$_{0.3}$)Se$_2$ stoichiometry, (2) 12 deposition cycles were used rather than 8, yielding a film of about 1.2 µm thickness, and (3) the final anneal temperature was raised to 525° C. rather than 450° C. (both for 20 min).

The component solutions for the CIGS layer were formed as follows:

Solution A (Cu$_2$S) was formed by mixing 9 mmol Cu$_2$S (1.432 g), 18 mmol S (0.5772 g) and 18.0 mL of anhydrous hydrazine (Aldrich, anhydrous, 98%), leading to a clear yellow solution after several days of stirring.

Solution B (In$_2$Se$_3$) was formed by mixing 6 mmol In$_2$Se$_3$ (2.7991 g), 6 mmol Se (0.4738 g) and 18.0 mL hydrazine (Aldrich, anhydrous, 98%), yielding a viscous pale yellow solution.

Solution C (Ga$_2$Se$_3$) was formed by mixing 8 mmol Ga (0.558 g) and 16 mmol Se (1.263 g) in 16 mL of hydrazine (Aldrich, anhydrous, 98%). To facilitate the dissolution of Ga, solution C was sonicated for 20-30 min before being left to stir. After 1 week of stirring, essentially all the original Ga had dissolved, yielding a colorless solution, with generally a very small amount of undissolved material remaining at the end of this process.

Solution D contained 12 mmol Se (0.948 mg) in 6.0 mL of hydrazine (Aldrich, anhydrous, 98%), forming a darkly colored solution.

The targeted Cu$_{1-y}$In$_{1-x}$Ga$_x$Se$_{2-z}$S$_z$ film with y=0.08, x=0.3, z about 0 was formed from a solution containing 4.6 mL sol. A (4.6 mmol Cu), 5.25 mL sol. B (3.5 mmol In), 3.0 mL sol. C (1.5 mmol Ga), 1.25 mL sol. D (2.5 mmol Se) and 2.4 mL hydrazine (Aldrich, anhydrous, 98%). Using this solution, a film of CIGS precursor was spin coated (800 rpm, 90 sec) onto the glass/Mo substrate. The film was dried and partially decomposed using a short (5 min.) treatment at 290 C in an inert atmosphere. Eleven additional CIGS layers were deposited in the same way to build up film thickness, after which the film was subjected to a final heat treatment at 525 C for 20 min.

The CdS layer (about 50 nm thick) was deposited using a standard chemical bath deposition approach similar to that described in M. A. Contreras et al., "Optimization of CBD CdS process in high efficiency Cu(In,Ga)Se$_2$-based solar cells," Thin Solid Films, Vol. 403-404, 204-211 (2002). Approximately 70 nm of high resistivity intrinsic ZnO was sputtered onto the CdS. A conducting ITO layer was deposited to form the nominally transparent top contact using a sputtering technique and targeting a thickness of 200 nm. A Ni (50 nm)/Al (2 µm) grid was e-beam evaporated through a shadow mask.

Figure 18:
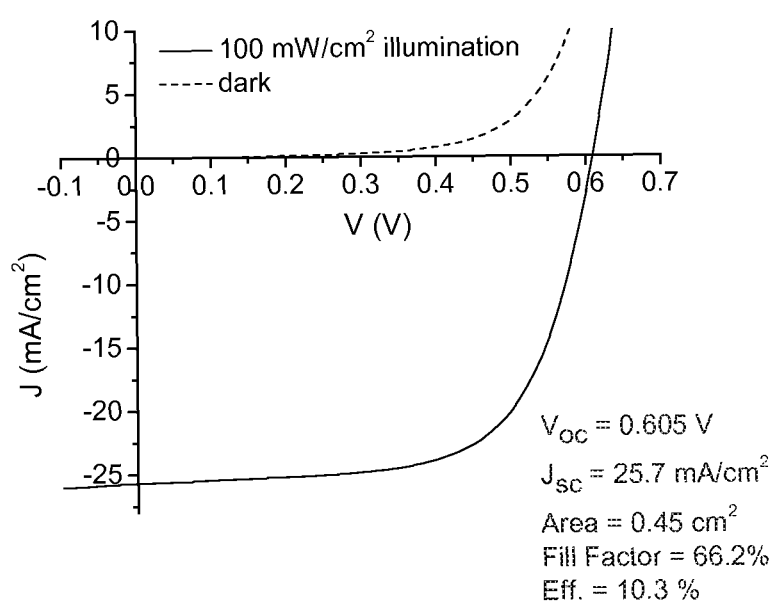
FIG. 18 shows the Current (I) versus Voltage (V) curve across the device structure of Example 4.

Referring to FIG. 18, the Current (I) versus Voltage (V) curve across the device structure is shown. The dashed line corresponds to a measurement made in the dark and the solid curve corresponds to a measurement made under illumination (1 sun, using a solar simulator).

Despite not having fully optimized all of the layers of the device, efficiencies of 10% and above are achievable using this approach, as seen in FIG. 18. An analogous device processed at 485 C rather than 525 C yielded a device efficiency of 8%, which demonstrates the ability to yield good efficiencies even when fabrication temperatures are maintained below 500 C. These results represent some of the best achieved for a fully solution processed absorber layers using a molecular-based precursor. Even better efficiencies are expected as the layer chemistries, thicknesses, deposition conditions, post-deposition treatments are fine-tuned and optimized. Accordingly, we conclude that the instant solution-processing approach to depositing the CIGS absorber layer provides significant advantages as well as flexibility to vary the chemistry of the absorber layer in this most critical device by varying the relative proportions of the component solutions used to prepare the spin coating deposition solution.

EXAMPLE 5

This example illustrates a working PV device of the general structure outlined in FIG. 1, with the CIGS absorber layer deposited using the method of the present invention, containing a small amount of Sb dopants, and processed at a relatively low temperature (425° C. maximum temperature).

A 1"×1" soda-lime glass plate (0.04" thickness) with about 600 nm of Mo sputtered on top formed the back contact of the device.

For each component solution, the solid components were weighed and the solutions were formed in a nitrogen-filled glove box with water and oxygen levels maintained below 1 ppm (as for the other examples).

The component solutions for the CIGS layer were formed as follows:

Solution A ($Cu_2S$) was formed by mixing 10 mmol $Cu_2S$ (1.592 g), 20 mmol S (0.6413 g) and 20.0 mL of anhydrous hydrazine (Aldrich, anhydrous, 98%), leading to a clear yellow solution after several days of stirring.

Solution B ($In_2Se_3$) was formed by mixing 10 mmol $In_2Se_3$ (4.6652 g), 10 mmol Se (0.7896 g) and 30.0 mL hydrazine (Aldrich, anhydrous, 98%), yielding a viscous pale yellow solution.

Solution C ($Ga_2Se_3$) was formed by mixing 8 mmol Ga (557.79 mg) and 16 mmol Se (1263.36 mg) in 16 mL of hydrazine (Aldrich, anhydrous, 98%). After 1 week of stirring, essentially all the original Ga had dissolved, yielding a colorless solution, with generally a very small amount of undissolved material remaining at the end of this process.

Solution D contained 10 mmol Se (789.6 mg) in 5.0 mL of hydrazine (Aldrich, anhydrous, 98%), forming a darkly colored solution.

Solution E ($Sb_2S_3$) was formed by mixing 1 mmol $Sb_2S_3$ (339.72 mg), 2 mmol S (64.13 mg) and 2.0 mL of anhydrous hydrazine (Aldrich, anhydrous, 98%), leading to a clear bright yellow solution after two days of stirring.

Two solutions were prepared by mixing the appropriate amounts of the component solutions described above for the CIGS film deposition. Solution F targeting $Cu_{1-y}In_{1-x}Ga_xSe_{2-z}S_z$ film (y=0, x=0.3, z≈0) with 0.5 atomic % Sb was formed by mixing 8.0 mL sol. A (8.0 mmol Cu), 8.4 mL sol. B (5.6 mmol In), 4.8 mL sol. C (2.4 mmol Ga), 3.2 mL sol. D (6.4 mmol Se), 40 µL sol. E (0.04 mmol Sb), and 0.24 mL hydrazine (Aldrich, anhydrous, 98%). Solution G targeting $Cu_{1-y}In_{1-x}Ga_xSe_{2-z}S_z$ film (y=0.75, x=0.3, z≈0) was formed by mixing 0.25 mL sol. A (0.25 mmol Cu), 1.05 mL sol. B (0.7 mmol In), 0.6 mL sol. C (0.3 mmol Ga), 0.4 mL sol. D (0.8 mmol Se), and 0.78 mL hydrazine (Aldrich, anhydrous, 98%). Both solutions were allowed to stir for one day at room temperature before the deposition. Using these two solutions (F and G), a film of CIGS precursor was spin coated (800 rpm, 90 sec) onto the glass/Mo substrate. The film was dried and partially decomposed using a short (5 min.) treatment at 290° C. in an inert atmosphere after each deposition. Eight layers were deposited in this way using solution F, and a thermal anneal at 425° C. for 10 min was applied after the $8^{th}$ deposition, followed by two layers of solution G (with intermediate anneal at 290° C. for 5 min) to build up film thickness, after which the film was subjected to a final heat treatment at 425° C. for 15 min, thereby yielding a CIGS film with composition Cu(23.3%), In(14.0%), Ga(7.5%), Se(55.2%), as determined by RBS (Sb is difficult to measure by RBS as it is close in mass to In), and a thickness of about 1.67 µm.

The other layers of the device (CdS, ZnO, ITO and Ni/Al metal grid) were put down in similar ways as described in examples 3 and 4.

Figure 19:
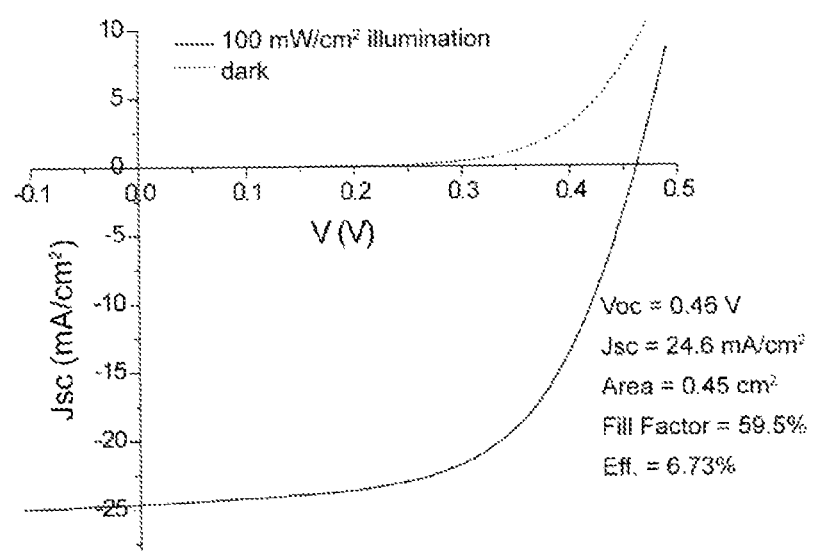
FIG. 19 shows the Current (I) versus Voltage (V) curve across the device structure of Example 5.

Referring to FIG. 19, the Current (I) versus Voltage (V) curve across the device structure is shown. The dashed line corresponds to a measurement made in the dark and the solid curve corresponds to a measurement made under one sun illumination.

Note that this efficiency (close to 7%) was obtained under relatively mild thermal treatment conditions (425° C. for 15 min), and that the various layers of the device have not been optimized for high-performance.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

We claim:

1. A solution-based deposition process for depositing an absorber layer on a substrate wherein said absorber layer comprises a doped or undoped composition represented by the formula:

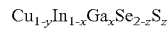

$$Cu_{1-y}In_{1-x}Ga_xSe_{2-z}S_z$$

wherein 0≤x≤1;
0≤y≤0.15; and
0≤z≤2 said process comprising the steps of:
contacting a hydrazinium-based chalcogenide precursor and a solvent, under conditions sufficient to produce a homogeneous solution;
coating said solution on said substrate to produce a coated substrate; and
heating said coated substrate to produce said absorber layer.

2. The process of claim 1, wherein said solution-based deposition process employs a hydrazinium-based chalcogenide precursor in a solution which is free of Cl, Br, and I impurities.

3. The process of claim 1, wherein said solvent is a non-hydrazine solvent.

4. The process of claim 3, wherein said non-hydrazine solvent is selected from the group consisting of: ethanolamine, DMSO, and a mixture thereof.

5. The process of claim 1, wherein said absorber layer has a composition represented by the formula represented by $CuInSe_2$.

6. The process of claim 1, wherein said absorber layer has a composition represented by the formula represented by $CuIn_{0.85}Ga_{0.15}Se_2$.

7. The process of claim 1, wherein said absorber layer has a composition represented by the formula $CuIn_{0.7}Ga_{0.3}Se_2$.

8. The process of claim 1, wherein said absorber layer has a composition represented by the formula 0.75 mol % Sb doped $CuInSe_2$.

9. The process of claim 1, wherein said absorber layer has a composition represented by the formula 1.0 mol % Sb doped $CuInSe_2$.

10. The process of claim 1, wherein said substrate is selected from the group consisting of: glass, Mo-coated glass, $Si/SiO_2$, metal foil, molybdenum foil, polyimide (Kapton) sheet, and Mo-coated polyimide.

11. The process of claim 1, wherein said coating step in said solution-based process is selected from the group consisting of: spin-coating, stamping, printing, doctor blading, spraying, and dipping.

12. The process of claim 1, wherein said heating step is carried out at a temperature from about 50° C. to about 600° C., and for a period of time from about 5 sec to about 10 hr.

13. The process of claim 12, wherein said temperature is from about 350° C. to about 550° C., and said period of time is from about 5 min to about 45 min.

14. The process of claim 1, wherein the steps of coating and heating are repeated at least once to deposit multiple layers of the same or different compositions to produce a stack having the same or different layers.

15. The process of claim 14, wherein the steps of coating and heating are repeated to produce a film having a uniform or a graded composition.

16. The process of claim 1, wherein the absorber layer has a large grain structure to minimize recombination at the grain boundaries.

17. The process of claim 16, wherein the grain size is from about 0.2 μm to about 2.0 μm.

18. The process of claim 1, wherein the absorber layer has a thickness of at least about 200 nm.

* * * * *